(12) United States Patent
Buzniak et al.

(10) Patent No.: US 7,959,732 B1
(45) Date of Patent: Jun. 14, 2011

(54) APPARATUS AND METHOD FOR MONITORING AND CONTROLLING CRYSTAL GROWTH

(75) Inventors: Jan Jozef Buzniak, Solon, OH (US); Valery Prunier, University Heights, OH (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 603 days.

(21) Appl. No.: 11/455,400

(22) Filed: Jun. 19, 2006

Related U.S. Application Data

(60) Provisional application No. 60/691,687, filed on Jun. 17, 2005.

(51) Int. Cl.
*C30B 35/00* (2006.01)

(52) U.S. Cl. ............ 117/206; 117/14; 117/15; 117/200; 117/900

(58) Field of Classification Search ............. 117/14, 117/15, 16, 23, 209, 219, 220, 223, 200, 117/900

See application file for complete search history.

(56) References Cited

U.S. PATENT DOCUMENTS

| | | | | |
|---|---|---|---|---|
| 2,944,875 A | * | 7/1960 | Leverton | 117/213 |
| 3,493,348 A | * | 2/1970 | Dessauer | 117/218 |
| 3,628,998 A | * | 12/1971 | Blum et al. | 117/42 |
| 3,934,983 A | * | 1/1976 | Bardsley et al. | 117/202 |
| 4,118,197 A | * | 10/1978 | Mackintosh et al. | 117/211 |
| 4,207,293 A | * | 6/1980 | Scholl et al. | 117/202 |
| 4,443,411 A | * | 4/1984 | Kalejs | 117/211 |
| 4,617,173 A | * | 10/1986 | Latka | 117/202 |
| 4,710,258 A | * | 12/1987 | Latka | 117/15 |
| 4,832,922 A | * | 5/1989 | Nishizawa | 117/202 |
| 4,874,458 A | * | 10/1989 | Nishizawa | 117/17 |
| 4,936,947 A | * | 6/1990 | Mackintosh | 117/16 |
| 5,002,798 A | * | 3/1991 | Donley et al. | 427/596 |
| 5,009,863 A | * | 4/1991 | Shima et al. | 117/213 |
| 5,087,429 A | * | 2/1992 | Kamio et al. | 117/213 |
| 5,116,456 A | | 5/1992 | Nestor | |
| 5,146,784 A | * | 9/1992 | Maresca et al. | 73/313 |
| 5,370,078 A | * | 12/1994 | Kou et al. | 117/209 |
| 5,408,951 A | * | 4/1995 | Tamida | 117/17 |
| 5,804,907 A | * | 9/1998 | Park et al. | 310/358 |

(Continued)

FOREIGN PATENT DOCUMENTS

| | | | |
|---|---|---|---|
| JP | 57200286 | * | 8/1982 |
| JP | 63-277592 | * | 11/1988 |
| JP | 2001152780 | * | 5/2001 |

OTHER PUBLICATIONS

R.L. Royer Jr., J.L. Rose, Ultrasonic Sensor System for $CaF_2$ Interface Monitoring with Rods Permanently Embedded in Crystal, Cryst. Res. Technol. 40, No. 8, 761-764 (2005).

(Continued)

*Primary Examiner* — Robert M Kunemund
(74) *Attorney, Agent, or Firm* — Renner, Otto, Boisselle & Sklar, LLP

(57) ABSTRACT

Apparatus and method for growing a crystal from a melt of a growth material, wherein crystal growth occurs at a solid-liquid interface between the melt and the crystal, and a characteristic of the solid-liquid interface is determined by using a float atop the melt and a detector for detecting displacement of the float. The characteristic of the solid-liquid interface can be at least one of the following: position, velocity or acceleration of the solid-liquid interface.

16 Claims, 1 Drawing Sheet

U.S. PATENT DOCUMENTS

| | | | |
|---|---|---|---|
| 5,868,831 A | | 2/1999 | Dornberger et al. |
| 5,998,910 A | * | 12/1999 | Park et al. .................... 310/358 |
| 6,013,872 A | * | 1/2000 | Woditsch et al. ............. 136/255 |
| 6,143,070 A | * | 11/2000 | Bliss et al. ...................... 117/49 |
| 2007/0044708 A1 | * | 3/2007 | Haynes et al. ................. 117/14 |
| 2009/0320743 A1 | * | 12/2009 | Sreedharamurthy et al. ... 117/32 |
| 2010/0031870 A1 | * | 2/2010 | Sreedharamurthy et al. ... 117/15 |

OTHER PUBLICATIONS

Engineering Science & Mechanics Nontechnical Abstract of MS Theses:2004, http://www.esm.psu.edu/~ax14/lakhtakia/NontechnicalAbstracts/MS-2004.html, downloaded on Mar. 6, 2006.

* cited by examiner

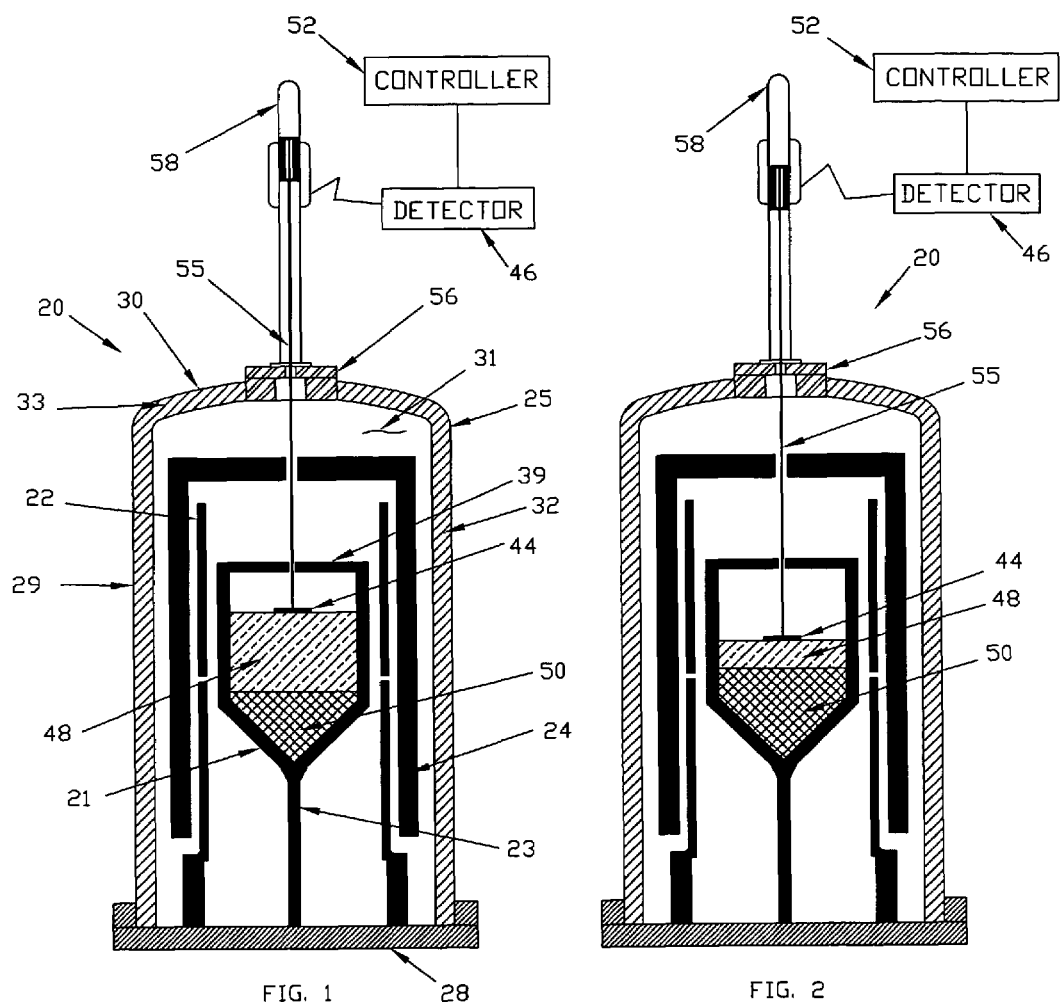

APPARATUS AND METHOD FOR MONITORING AND CONTROLLING CRYSTAL GROWTH

RELATED APPLICATION

This application claims the benefit of Provisional Application No. 60/691,687 filed on Jun. 17, 2005, which application is hereby incorporated by reference in its entirety.

FIELD OF THE INVENTION

The present invention relates generally to an apparatus and method for growing crystals and more particularly to an apparatus and method for monitoring and controlling crystal growth.

BACKGROUND

A number of processes heretofore have been employed to grow crystals of various materials from a melt. One such process is the Bridgman-Stockbarger process wherein a seed crystal is positioned at the base of the crucible into which melt stock is loaded. The crucible is heated to form a melt that varies in temperature from the seed temperature to higher temperatures upward in the melt. The crucible is then lowered slowly from a high temperature melt zone to a lower temperature cooling zone to induce crystal growth from the seed crystal at the base of the crucible to the top of the melt.

Another crystal growth technique is generally referred to as vertical gradient freeze process. This process maintains the crucible stationary while otherwise inducing vertical crystal growth in the crucible. For example, overall heating power may be lowered so as to move the melting point isotherm upward through the crucible. Another procedure involves use of a heat exchanger to extract heat from the base of the crucible.

The ability to grow high quality crystals with acceptable yields depends in large part on the ability to monitor and control the solid-liquid interface position. This is not an easy task given the environment in which the crystals are grown. One method to locate the solid-liquid interface is to physically contact the crystal at the interface with a probe. This method, however, may cause growth defects at the interface and may leave debris particles from the probe and the crucible lid through which the probe passes, thus contaminating the melt.

Another method that has been proposed uses ultrasonics. The interface position is determined using the difference in ultrasonic velocity between solid and liquid phases. This method, however, suffers from low resolution which compromises the accuracy of crystal growth.

A further method that has been proposed uses X-ray radioscopy. This method is based on the principle that X-ray absorption for a given material is a function of density gradient between solid and liquid phases. This method, however, requires furnace shielding, is difficult to practice in an industrial environment, and suffers from low accuracy due to hot zone absorption.

SUMMARY OF THE INVENTION

This present invention employs a float as a means to provide a precise measurement of the position, velocity and/or other position or movement characteristic of the solid-liquid interface during crystal growth. The float floats atop the melt so that its position changes with the volume change that occurs during crystal growth because of the difference in density of the melt and crystal. A linear variable differential transducer (LVDT) or other position sensor may be used to determine the position of the float. The use of the float enables continuous and real time monitoring of the position, velocity and/or other position or movement characteristic of the solid-liquid interface during crystal growth. In addition, the invention can be practiced with various types of solidification methods including the Bridgman-Stockbarger and gradient freeze methods.

Accordingly, the invention provides a method for growing a crystal from a melt of a growth material, wherein crystal growth occurs at a solid-liquid interface between the melt and the crystal, and a characteristic of the solid-liquid interface is determined by using a float atop the melt and a detector for detecting displacement of the float. The characteristic of the solid-liquid interface can be at least one of the following: position, velocity or acceleration of the solid-liquid interface.

The invention also provides an apparatus for growing a crystal from a melt of a growth material. The apparatus comprises a crucible for containing the melt, a float for floating atop the melt, and a detector for detecting displacement of the float.

The float is made from non-reactive material and apparent density of the float is less than the density of the melt. A variety of shapes can be used, provided that the shape floats on the melt.

The float, for example, may be made of graphite and can have a planar shape such as a disc shape. Alternatively, the float can have a ball shape.

The detector, which may continuously monitor the position of the float, can include a camera and/or an LVDT. In a typical configuration, the crystal and melt are located in an enclosure, and the float is connected to a rod that passes through a hole in a wall of the enclosure with an end portion of the rod located outside the enclosure, whereby movement of the float effects corresponding movement of the rod that can be detected by the detector located outside the enclosure. The displacement of the float may be monitored on a continuous basis in real time.

The foregoing and other features of the invention are hereinafter more fully described and particularly pointed out in the claims, the following description and the annexed drawings setting forth in detail certain illustrative embodiments of the invention, these being indicative, however, of but a few of the various ways in which the principles of the invention may be employed.

BRIEF DESCRIPTION OF THE DRAWING

FIG. 1 is a schematic cross-sectional view of a crystal growth furnace according to the invention, showing a growth monitoring float in a first position.

FIG. 2 is a schematic cross-sectional view of the crystal growth furnace, showing the growth monitoring float in a second position.

DETAILED DESCRIPTION

The subject invention will be described mainly in terms of growing a metal halide crystal, more particularly a metal fluoride crystal, and most particularly a calcium fluoride ($CaF_2$) crystal. However, such description is merely exemplary and it will be appreciated by those skilled in the art that the inventive concept described is equally applicable to the growth of other compounds including, for example, various other alkaline earth halides, alkali metal halides, rare earth halides, oxides, semiconductors; in short, to the growth of any melting compound whose solid density exceeds its liquid density. Additionally, the terms "parallel", "perpendicular", "vertical", "horizontal", and the like are not intended to mean exactly parallel, exactly perpendicular, and so on, unless expressly indicated. Rather, these terms are intended to encompass a range of variation as would normally be understood by one having ordinary skill in the art.

Referring now in detail to the drawings and initially to FIG. 1, an apparatus for growing crystals according to the invention is indicated generally at 20. The apparatus 20, herein referred to as a crystal growing furnace, generally comprises a crucible 21, a crucible heater assembly 22, crucible support/elevator assembly 23, insulation envelope 24 and an environmental chamber 25. The crucible 21, crucible heater assembly 22 and insulation envelope 24 are housed within the environmental chamber 25 that provides a controlled environment in which the crystals are grown. The particular environment to be maintained depends on the material of the crystal. For growing calcium fluoride, for example, it is desired to maintain a vacuum within the environmental chamber 25. It also is contemplated that the environmental chamber may not be necessary for those materials that can be grown in the presence of air at atmospheric pressure.

In the illustrated embodiment the environmental chamber 25 is a vacuum chamber comprising a base plate 28, cylindrical wall 29 and dome 30, which are joined together to form a gas-tight interior space 31. For high temperature operation as is needed to grow calcium fluoride crystals, the wall 29 and dome 30 preferably are water cooled by passage of cooling water through internal water channels 32 and 33, respectively. Although not shown, suitable means are provided for evacuating the vacuum chamber as is desired when growing single crystals of calcium fluoride.

The crucible heater assembly 22 may be of conventional type adapted for the particular growth technique to be used to grow the crystal. Typically the furnace will be configured with an upper heat zone 47 that for the most part is maintained at a higher temperature than a lower heat zone 48. It is in the upper heat zone that the melt stock is melted and maintained in a molten state while the lower heat zone is maintained at a lower temperature below the melting point of the crystal material. Accordingly, the lower heat zone may be referred to as a cooling zone and the upper heat zone may be referred to as a melt zone.

The support/elevator assembly 23 can be operated to lower the crucible from the upper melt zone to the lower cooling zone during growth of a crystal using a Bridgman-Stockbarger-type method. Alternatively, in the illustrated embodiment the support/elevator assembly is kept stationary and the heater assembly is operated to create a thermal temperature gradient across the crucible that progressively moves upwardly in a well known manner to effect crystal growth using a vertical gradient freeze-type method. In FIGS. 1 and 2, a vertical gradient freeze-type method is used to illustrate the principles of the invention.

When a seed crystal is used, it is placed in a seed pocket (not shown) at the bottom interior of the crucible 21 to provide a desired crystallographic orientation of the crystal to be grown. A charge of crystal growth stock then is loaded into the crucible. A cover plate 39 is placed on and secured to the crucible by some readily removable means (not shown), and the crucible, heater assembly 22, insulation envelope 24 and vacuum chamber 25 are assembled in the above described manner.

After assembly, the vacuum chamber 25 is evacuated to a pressure equal to or less than about 1.0 mTorr of Hg. After evacuation, power is applied to the crucible heater assembly 22 to heat the crucible 21. Power applied to the crucible heater assembly 22 usually will be increased gradually to slowly increase the temperature of the crystal growth stock.

Power is increased in the heaters until the temperature in the crucible is above the melting point of the charge, typically with the temperature in an upper zone being slightly higher than that in a lower zone. After the entire charge and a desired portion of the seed crystal melts, power to upper and lower heaters of the crucible heater assembly 22 is decreased, either simultaneously or alternately, to provide a unidirectional solidification from the seed crystal upward. The power and temperature decrease preferably is controlled to provide a solidification rate of 0.1-10 mm/hour to create an optically clear solid crystal of calcium fluoride. This power and temperature decrease is continued until all of the molten material is solidified.

After the entire charge has been solidified, the power to the heaters then may be decreased to lower the temperature in the crystal. After achieving approximately room temperature in the grown crystal the vacuum chamber is restored to atmospheric pressure and the vacuum chamber, insulation envelope, heater assembly and crucible are disassembled as necessary. The grown crystal may then be removed from the crucible and later processed for providing crystal components for other devices such as lasers and lithography equipment.

In accordance with the invention, monitoring of the growth process is effected by means of a float 44 and a detector 46. The float 44 can be positioned atop the growth stock material prior to being melted, or can be lowered into contact with the top surface of the melt 48 after the growth stock material has been heated to a molten state, or at any intermediate point in time. The float is of sufficient buoyancy that it will float on the top surface of the melt during crystal growth. The float floats atop the melt so that its position changes with the volume change that occurs during crystal growth because of the difference in density of the melt 48 and crystal 50. That is, the crystal to be grown will have a density greater than that of the melt. Accordingly, the vertical height of the grown crystal necessarily will be less than the height of the melt when in its fully molten state which in turn will be less than height of the crucible which, of course, is the upper limit of the height of the charge that can be located into the crucible.

The position of the float is monitored by the detector 46 that typically will be located outside the environmental chamber 25 where it will not be subjected to the environmental conditions within the environmental chamber. The position of the float can be communicated from inside the environmental chamber and/or crucible to outside the environmental chamber and/or crucible by any suitable means. In the illustrated embodiment, the float is coupled to a rod 55 that extends through an aperture in the cover of the crucible if employed and an aperture at the top of the environmental chamber if employed. As shown, the apex of the dome of the environmental chamber can have removably fastened thereto a cover plate 56 that closes a top access opening of the environmental chamber. This plate can be provided with a hole through which the rod extends and in which the rod is freely movable vertically. As shown, the cover plate may have attached thereto in sealed relationship an enclosure for the end of the rod 55 that projects, such enclosure functioning to preserve environmental conditions, such as a vacuum, within the environmental chamber. The enclosure may be a glass tube that is closed at its top end and transparent for allowing the position of the rod to be visually monitored or monitored by a camera (detector 46) located outside the tube 58.

The rod 55 extends above the environmental chamber 25 sufficiently for interfacing with the detector 46. The detector can be of any suitable type of displacement/position sensor in the configuration illustrated in FIGS. 1 and 2. For example, the detector can be an LVDT configured to provide an output representative of the position or displacement of the rod, which correlates to displacement or movement of the float. The core of the LVDT, for example, may be attached to the rod and its windings fixed in relation to the environmental chamber and/or crucible. The output of the LVDT can be processed by suitable electronics to provide a precise measurement of the position, velocity and/or other position or movement characteristic of the float, which correlates to the position, velocity and/or other position or movement characteristic of the solid-liquid interface during crystal growth.

The detector alternatively or additionally may include a camera for monitoring the position of the rod. The camera, which for example can be mounted on the top of the environmental chamber, can visually monitor the edge position or displacement of the rod, which correlates to the displacement or movement of the float. The output of the camera can be processed by suitable electronics and/or image analysis software to provide, like the LVDT, precise measurement of the position, velocity and/or other position or movement characteristic of the float.

The float 44 may be made of graphite or any other suitable non-reactive material. The float can have a planar shape such as a disc shape. Alternatively, the float can have a ball shape. The float may be of any suitable size or shape provided that the float will float on the melt, i.e., move in relation to the volumetric change of the melt arising from the progressive solidification of the melt during crystal growth.

As will be appreciated, the float and detector enable continuous and real time monitoring of the position, velocity and/or other position or movement characteristic of the solid-liquid interface during crystal growth. This information can be used to provide feedback to a controller 52 that controls one or more of the operational characteristics of the crystal growing furnace 20, such as power or temperature. Thus, one or more of these operational characteristics can be controlled as a function of the output of the detector which is representative of the position, velocity and/or other position or movement characteristic of the solid-liquid interface during crystal growth. For example, the power supplied to heaters used to heat a region in the crystal growing furnace containing the melt, can be varied in real time using feedback from the detector.

Although the invention has been shown and described with respect to a certain preferred embodiment or embodiments, it is obvious that equivalent alterations and modifications will occur to others skilled in the art upon the reading and understanding of this specification and the annexed drawing. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure that performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An apparatus for growing a crystal from a melt of a growth material, comprising
    a crucible for containing the melt,
    a float disposed within the crucible for floating atop the melt,
    a detector for detecting displacement of the float, wherein the detector includes at least one of a camera and an LVDT, and
    a controller that uses an output of the detector to determine a characteristic of the solid-liquid interface.

2. An apparatus as set forth in claim 1, wherein the float is made of non-reactive, physically stable material that is buoyant in the melt.

3. An apparatus as set forth in claim 1, wherein the float is made of graphite.

4. An apparatus as set forth in claim 1, wherein the float has at least one of a planar shape, a disc shape, and a ball shape.

5. An apparatus as set forth in claim 1, wherein the detector continuously monitors the position of the float.

6. An apparatus as set forth in claim 1, wherein the detector monitors the position of the float in real time.

7. An apparatus as set forth in claim 1, wherein the crucible and float are located in an enclosure and the detector is located outside the enclosure, and the float is connected to a rod that passes through a hole in a wall of the enclosure with an end portion of the rod located outside the enclosure, whereby movement of the float effects corresponding movement of the rod that can be detected by the detector.

8. An apparatus as set forth in claim 1, wherein the displacement of the float is monitored on a continuous basis in real time.

9. An apparatus as set forth in claim 1, further comprising a controller for controlling, as a function of the determined characteristic of the solid-liquid interface, one or more operational characteristics of a crystal growing furnace in which the melt is disposed.

10. An apparatus as set forth in claim 1, wherein the determined characteristic of the solid-liquid interface is the position of the solid-liquid interface.

11. An apparatus as set forth in claim 1, wherein the determined characteristic of the solid-liquid interface is the acceleration of the solid-liquid interface.

12. An apparatus as set forth in claim 9, wherein the one or more operational characteristics includes power supplied to heaters used to heat a region in the crystal growing furnace.

13. An apparatus as set forth in claim 9, wherein the one or more operational characteristics are controlled on a continuous basis in real time.

14. An apparatus as set forth in claim 1, wherein the determined characteristic of the solid-liquid interface is the velocity of the solid-liquid interface.

15. An apparatus as set forth in claim 1, wherein the detector includes an LVDT.

16. An apparatus as set forth in claim 1, wherein the detector includes a camera.

* * * * *